United States Patent
Cheng et al.

(10) Patent No.: US 7,339,787 B2
(45) Date of Patent: Mar. 4, 2008

(54) HEAT SINK MODULE FOR DISSIPATING HEAT FROM A HEAT SOURCE ON A MOTHERBOARD

(75) Inventors: Yi-Lun Cheng, Taipei (TW); Chun-Lung Lin, Taipei (TW); Feng-Ku Wang, Taipei (TW)

(73) Assignee: Inventec Corporation, Taipei (TW)

( * ) Notice: Subject to any disclaimer, the term of this patent is extended or adjusted under 35 U.S.C. 154(b) by 130 days.

(21) Appl. No.: 11/403,948

(22) Filed: Apr. 14, 2006

(65) Prior Publication Data

US 2007/0242436 A1 Oct. 18, 2007

(51) Int. Cl.
*H05K 7/20* (2006.01)

(52) U.S. Cl. .............. 361/695; 361/700; 361/704; 257/714; 257/715; 257/721; 174/15.1; 174/15.2; 165/80.3; 165/80.4; 165/104.26

(58) Field of Classification Search ............ None
See application file for complete search history.

(56) References Cited

U.S. PATENT DOCUMENTS

| | | | |
|---|---|---|---|
| 6,328,097 B1 * | 12/2001 | Bookhardt et al. .... | 165/104.33 |
| 6,442,025 B2 * | 8/2002 | Nakamura et al. ......... | 361/695 |
| 6,621,698 B2 * | 9/2003 | Chang ...................... | 361/687 |
| 6,654,245 B2 * | 11/2003 | Kawashima et al. ....... | 361/695 |
| 6,914,782 B2 * | 7/2005 | Ku ............................. | 361/700 |
| 7,057,897 B2 * | 6/2006 | Leu ............................ | 361/704 |
| 7,140,423 B2 * | 11/2006 | Chang ................... | 165/104.33 |
| 2004/0001316 A1 * | 1/2004 | Kamikawa et al. ......... | 361/700 |
| 2005/0083658 A1 * | 4/2005 | Huang ......................... | 361/700 |

* cited by examiner

*Primary Examiner*—Boris Chervinsky
(74) *Attorney, Agent, or Firm*—Rabin & Berdo, P.C.

(57) ABSTRACT

A heat sink module includes a fan set and a heat sink plate. The fan set is integrated as a whole, reducing manufacture time, and the material of the fan set is plastic, thus reducing the weight as well. Due to the hook design of the fan set and the ear design of the heat sink plate, the number of screws is reduced. Furthermore, the screws pass through the first lug of the heat sink plate and the second lug of the fan set, so that the heat sink plate and the fan set are fixed on the motherboard, and thereby the number of the parts to be fixed by screws is reduced. Heat from the heat source on the motherboard is conducted to the fan set to be dispersed through the heat sink plate extending to the heat source and covering the fan set.

8 Claims, 5 Drawing Sheets

HEAT SINK MODULE FOR DISSIPATING HEAT FROM A HEAT SOURCE ON A MOTHERBOARD

BACKGROUND OF THE INVENTION

1. Field of Invention

The present invention relates to a heat sink device and more particularly to a heat sink module having the design of reducing the screws and being suitable for dissipating heat produced by a chip on the motherboard.

2. Related Art

The development of information science and technology enables the computer to be widely used. As the computing function and speed of the electric elements, such as the central processing unit and the display chip, are enhanced, the high speed and large amount of computing results in a problem of high temperature accordingly. However, there is somewhat a limitation to the operation temperature of each of the electric elements. For the electric elements, high temperature affects operation efficiency, and in some severe circumstances, high temperature may further damage or even burn the electrical elements. Therefore, the heat sink has become crucial in product design. In order to make the computer run normally under normal temperature, the heat sink device has become an essential means for the computer.

The high temperature produced due to the high speed or larger amount of computing of the central processing unit of the ordinary computer is reduced as the generated heat is taken away by the assembled heat sink module. The conventional assembled heat sink module is fixed on the motherboard mainly by locking screws. That is, the heat sink plate is locked on the fan seat (by about 3-4 screws), and at the same time, the heat sink modules are locked to the motherboard respectively (by about 3-4 screws). Therefore, it takes a long time to assemble. For the company, more operators are needed for the product line for assembly and fixation of different portions. As such, the manufacturing cost is raised due to the increasing number of operators, and the portions needing to be assembled and fixed may be left out due to the carelessness of the operators. Thus, it is a necessity to reduce the portions to be locked by screws and the procedures.

Additionally, based upon consumers' demands for portable computers and due to gradually reduced private life space, it is an object of the technological revolution to make the portable computer light and thin. Consequently, the heat sink required by the heat element is also developed towards the same object, i.e. the weight of the heat sink directly influences the thinning of the portable computer. And the conventional fan set generally includes a fan seat and fan blades, and more labor hours and operators are needed for assembly, thus increasing the manufacturing cost.

SUMMARY OF THE INVENTION

In view of the above problems, a main object of the present invention is to provide a heat sink module to solve the problems or disadvantages of the prior art.

In a heat sink module, the heat sink plate extending to the heat source and covering the fan set is used to conduct the heat from the heat source on the motherboard to the fan set for heat sinking. The heat sink module includes a fan set and a heat sink plate. The fan set is integrated as a whole, reducing manufacturing time, and the material of the fan set is plastic, thus reducing the weight as well. Furthermore, the material of the heat sink plate is of high temperature resistance and preferable heat conductivity; for example aluminum or an aluminum alloy, thus providing a good heat conduction effect. As such, the heat generated from the heat source is taken to the fan set to be dissipated. The fan set is fixed to the heat sink plate by the design of the hook portion of the fan set catching the ear portion of the heat sink plate, so that the heat sink plate can cover and be fixed on the fan set, and the number of screws is reduced. At the same time, the screws pass through the first lug of the heat sink plate and the second lug of the fan set, so that the heat sink plate and the fan set are fixed on the motherboard simultaneously. Conventionally, the heat sink plate is fixed to the fan, and the heat sink needs to be fixed on the motherboard, and the fan also needs to be fixed on the motherboard. By the method of the present invention, the number of screws and the manufacture cost are reduced, and the frequency of cases in which portions in need of locking screws are neglected due to the carelessness of operators during manufacturing is further reduced.

The detailed features and advantages of the present invention are described in the detailed description below. The technical contents of the present invention are apparent to those skilled in the art from the contents below and those skilled in the art can implement the present invention accordingly. And based upon the contents, claims, and drawings of the specification, any of those skilled in the art can easily understand the related objects and advantages of the present invention.

The above descriptions, related to the contents and the following detailed description of the present invention, are intended to demonstrate and explain the principle of the present invention, and provide a further explanation for the claims of the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

In order to further understand the objects, structure, features, and functions of the present invention, the detailed description is given below in conjunction with the embodiments.

Figure 1:
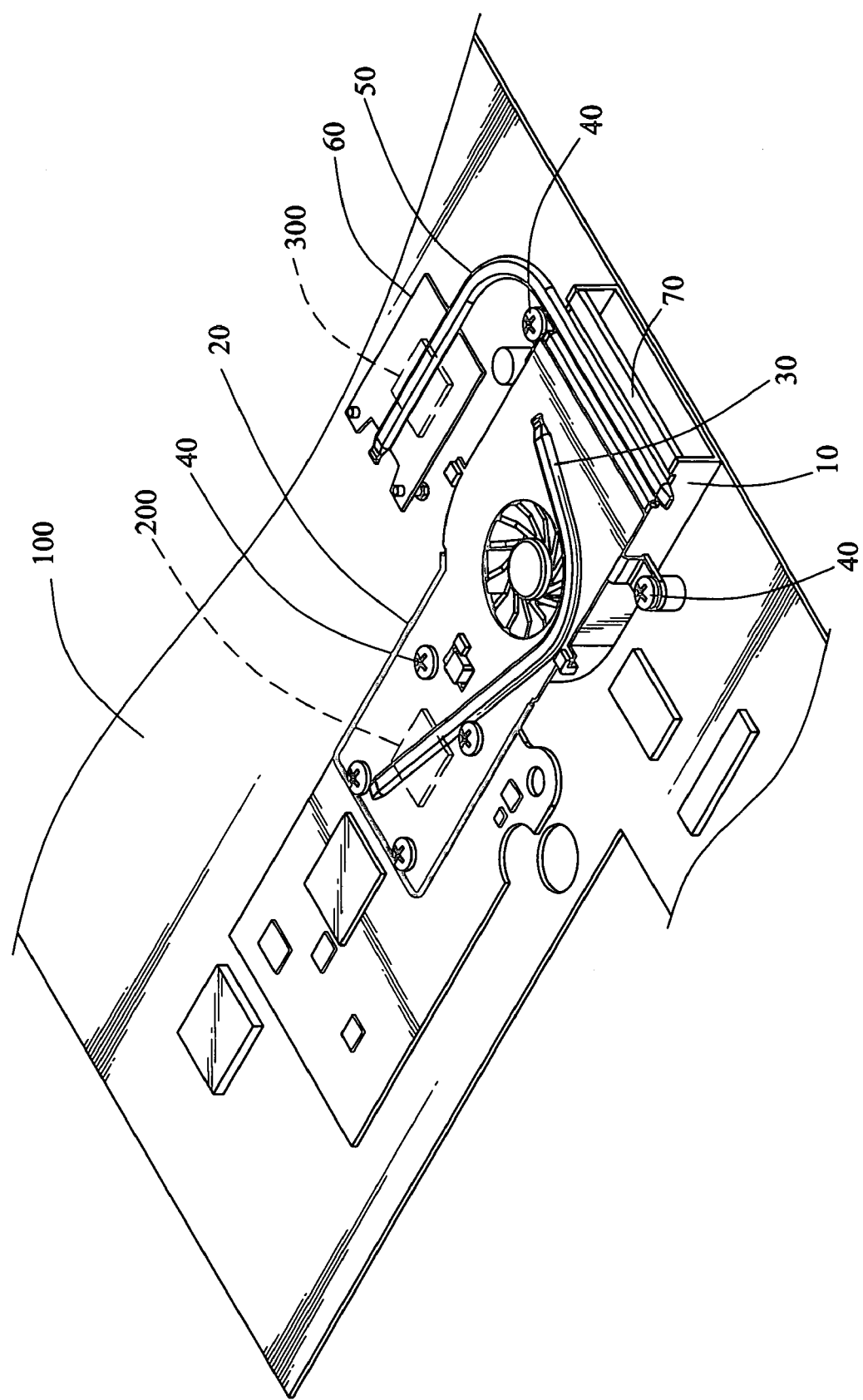
FIG. 1 is a view of the first embodiment of the heat sink module of the present invention.

As shown in FIG. 1, it is a view of the first embodiment of the heat sink module of the present invention. The motherboard 100 has many electronic elements thereon, but the temperature of these electric elements is relatively raised due to high speed computing. However, there is somewhat a limitation to the operation temperature of each of the electric elements. For the electric elements, high temperature affects operation efficiency, and in some severe circumstances, high temperature may further damage or even burn the electrical elements. Therefore, the heat sink has become crucial in product design. In the drawing, the heat sink function is illustrated by two electrical elements for the heat source, for example, a first chip 200 and a second chip 300. The first chip 200 is covered with a heat sink plate 20 made of a material with high temperature resistance and preferable heat conductivity, for instance aluminum or an aluminum alloy. And the second chip 300 is also covered with a first heat sink 60 made of a material with high temperature resistance and preferable heat conductivity, for example aluminum or an aluminum alloy. A fan set 10 is disposed on a motherboard 100 for heat sinking. The fan set 10 is covered with a heat sink plate 20 extending to the first chip 200. A heat pipe 30 made of the material with high temperature resistance and preferable heat conductivity (for instance aluminum or an aluminum alloy) is further added onto the heat sink plate 20 to enhance the heat conduction effect. If an electrical element is disposed at the position of the second chip 300, the heat can be conducted from a first heat sink 60 to a second heat sink 70 on the fan set 10 through a second heat pipe 50 made of a material with high temperature resistance and preferable heat conductivity (for example aluminum or an aluminum alloy), and then dissipated through the fan set 10. Using such a design, the electrical elements in need of dissipating heat can be mounted on the motherboard 100 freely, without limitation as to the positions of the electrical elements in need of dissipating heat.

Figure 2:
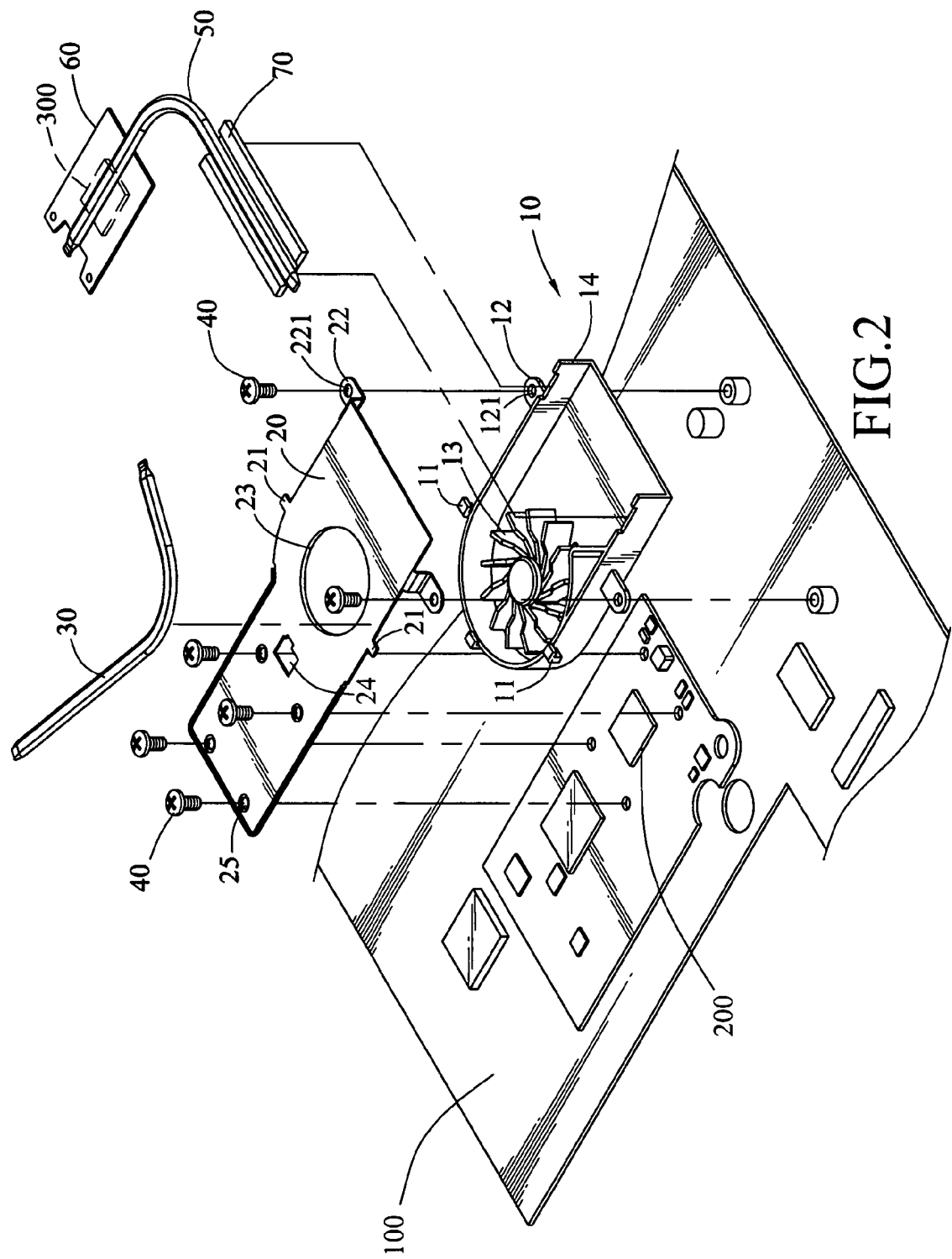
FIG. 2 is an exploded view of the heat sink module structure of the present invention.

As shown in FIG. 2, it is an exploded view of the structure of the heat sink module of the present invention. The heat sink module is mainly comprises a fan set 10 and a heat sink plate 20. The fan blade 13 and the fan seat 14 of the conventional fan set 10 are assembled individually, while the design of integration can reduce the manufacture time. Furthermore, the material of the fan set 10 is plastic, which can further meet the light weight requirement of current design. Since the heat sink plate 20 made of high temperature resistance and preferable heat conductivity material has favorable heat conduction effect, the heat generated by the heat source can be taken to the fan set 10 to be dissipated. And a first heat pipe 30 is disposed on the heat sink plate 20, further enhancing the heat conduction effect. At the same time, the heat sink plate 20 acts as the cover of the fan set 10, thus saving the cost of the cover of the fan set 10.

Figure 3:
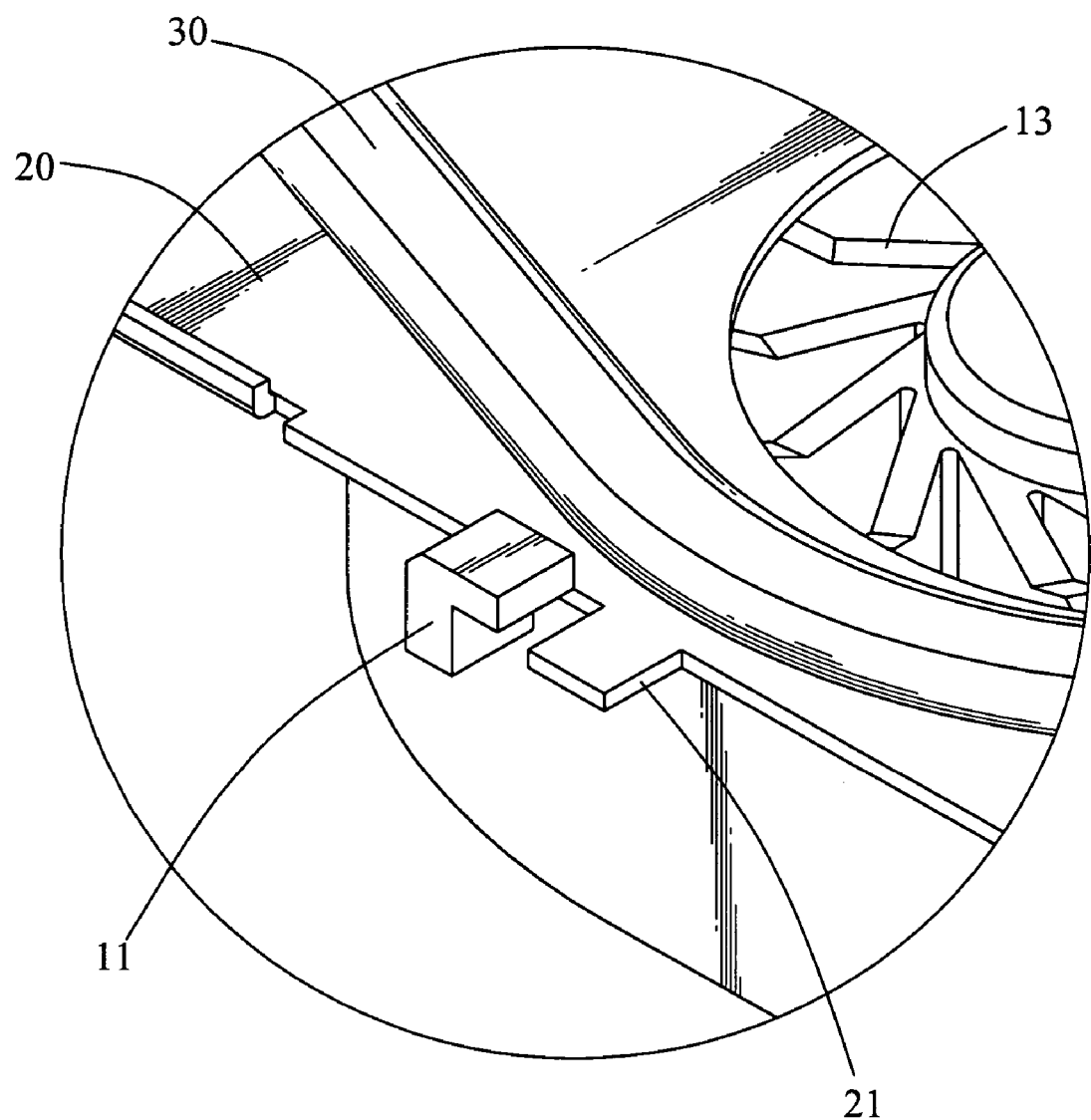
FIG. 3 is a partial enlarged view before the hook portion catches ear portion in FIG. 2.
Figure 4:
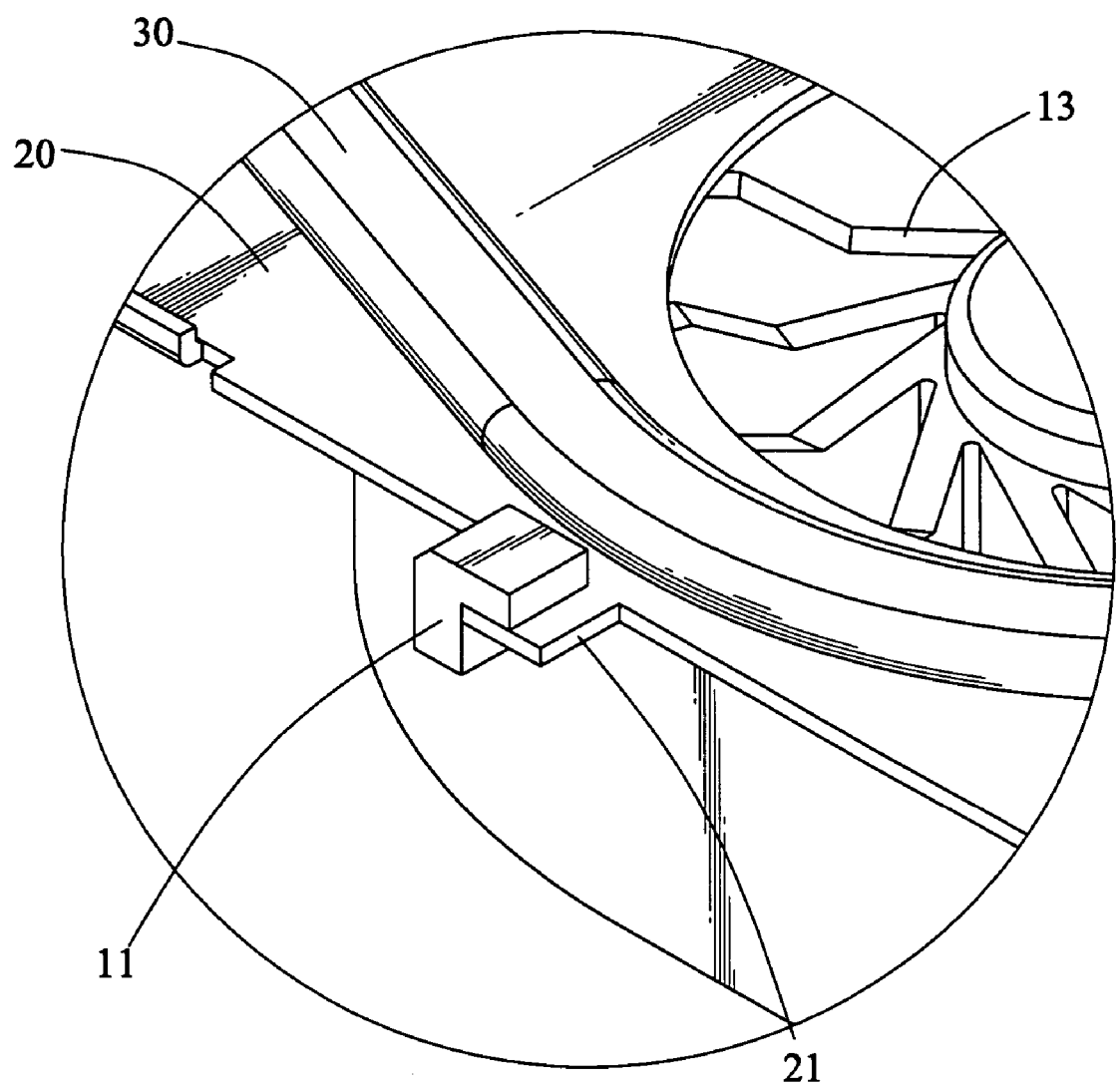
FIG. 4 is a partial enlarged view after the hook portion catches the ear portion in FIG. 2.

For the design of fixing the heat sink plate 20 and the fan set 10, the heat dissipation plate 20 and the fan set 10 are locked conventionally by screws 40. As such, more operators are needed for the product line of locking screws, thus the manufacturing cost is increased, and the portions in need of locking screws 40 are neglected due to the carelessness of the operators. Therefore, it is indeed a great contribution to production to reduce the portions in need of locking screws 40. In the present invention, in order to reduce the portions in need of locking screws 40, hook portions 11 are designed around the fan set 10. Although three hook portions 11 are shown in the drawing, the number of hook portions 11 can be one, two, or more than three in practice. Correspondingly, the ear portions 21 are disposed on the heat sink plate 20 opposite to the hook portions 11 of the fan set. Similarly, although three ear portions 21 are shown in the drawings, the number of ear portions 21 can be one, two, or more than three in practice. One may refer to a partial enlarged view, as shown in FIG. 3, before the hook portions catch the ear portions in FIG. 2. When the heat sink plate 20 covers the fan set 10, the relative positions of the ear portions 21 of the heat sink plate 20 and the hook portions 11 of the fan set 10 are shown in the drawing. One may refer to a partial enlarged view, as shown in FIG. 4, after the hook portions catches the ear portions in FIG. 2, when the hook portions 11 of the fan set 10 catches the ear portions 21 of the heat sink plate. The ear portions 21 of the heat sink plate 20 is pushed toward the hook portions 11 of the fan set 10, and after the ear portions 21 is pushed to the interior of the hook portions 11, the hook portions 11 catches the ear portions 21, so that the ear portions 21 cannot move up and down. As shown in FIG. 2, when the heat sink plate 20 is disposed on the fan set 10 firstly, the first opening 23 of the heat sink plate 20, right opposite to the fan blade 13, is used to dispose the heat sink plate 20 onto the fan set 10. As shown in the drawing, the hook portions 11 are disposed on both the right and left sides and in front of the hook portions 11 respectively. When the ear portions 21 of the heat sink plate 20 is pushed to the hook portions 11, the ear portions 21 on both sides of the heat sink plate 20 are disposed aligning with the hook portions 11 on both sides of the fan set 10. At the same time, the hook portions 11 in front of the fan set 10 are set in the second opening 24 in front of the heat sink plate 20. Subsequently, the heat sink plate 20 is pushed towards the hook portions 11, and at the same time, the ear portions 21 are pushed to the interior of the hook portions 11. The hook portions 11 are arranged in a triangle like in the drawing, so that the heat sink plate 20 can be further prevented from moving forward horizontally. Furthermore, the second lugs 12 are disposed around the fan set 10, although only two second lugs 12 are shown in the drawing, the number of second lugs 12 can be one or more than two in practice. Correspondingly, the first lugs 22 are disposed on the heat sink plate 20 corresponding to the position of the second lugs 12 of the fan set 10. Similarly, although only two first lugs 22 are shown in the drawing, the number of first lugs 22 can be one or more than two. A second lockhole 121 is set in the second lug 12, and the first lockhole 221 is set on the first lug 22. The first lug 22 can be folded downwards according to the design of the present invention, so that the first lug 22 of the heat sink plate 20 is overlapped with the second lug 12 of the fan set 10 closely, when the heat sink plate 20 covers the fan set 10. At the same time, the first lockhole 221 of the first lug 22 is aligned with the second lockhole 121 of the second lug 12. And then the screw 40 passes through the first lockhole 221 of the first lug 22 and the second lockhole 121 of the second lug 12, and then fixed on the motherboard 100. Finally, the screw 40 passes through the four third openings 25 in front of the heat sink plate 20 respectively, and then fixed on the motherboard 100. Conventionally, the heat sink plate 20 and the fan set 10 are fixed together, and then the heat sink plate 20 and the fan set 10 are fixed on the motherboard 100 respectively. As such, more screws 40 and operators as well as procedures for locking screws 40 are needed, thus consuming manufacturing costs. Therefore, the present invention employs some designs to improve the problems in the aspect.

Figure 5:
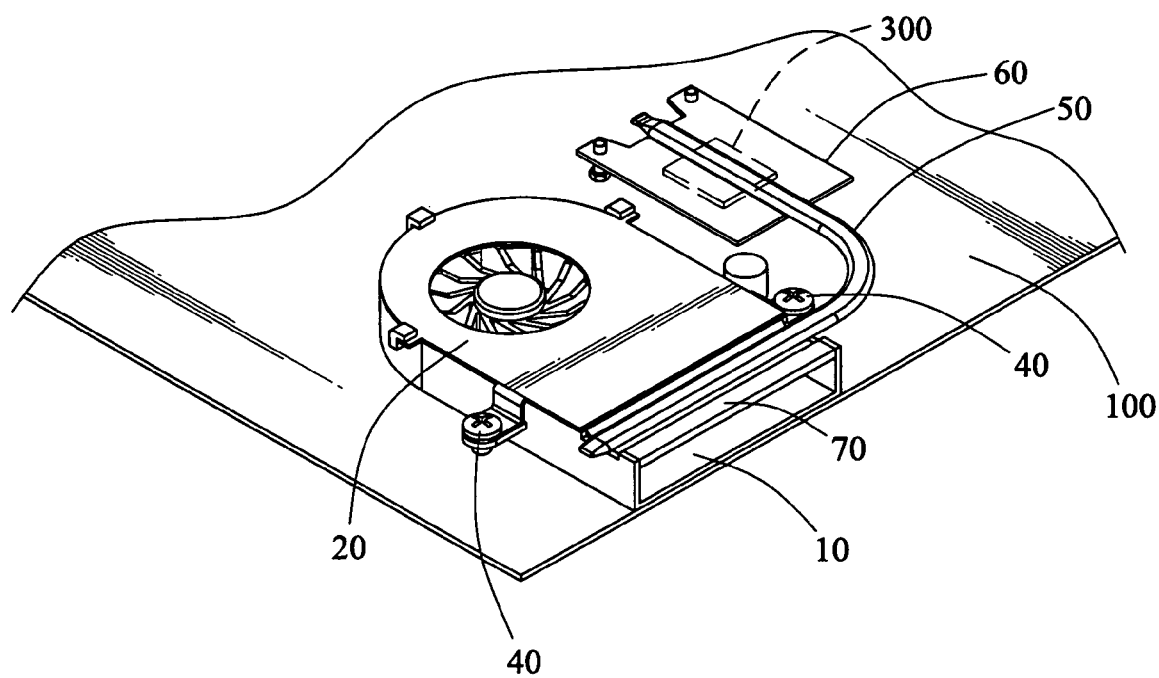
FIG. 5 is a view of the second embodiment of the heat sink module according to the present invention.

Please refer to FIG. 5, which is a view of the second embodiment of the heat sink module according to the present invention. If the position of the heat source is different from that of the first chip 200 as shown in FIG. 1, the second heat pipe 50 can be used to conduct heat from the farther heat source to the second heat sink plate 70 of the fan set 10 as shown in FIG. 5. The first heat sink 60 is fixed on the motherboard 100, so that the second chip 300 is sandwiched between the first heat sink 60 and the motherboard 100. A second heat pipe 50 is disposed on the first heat sink 60 and extends to the heat sink plate 20 on the fan set 10. The heat from the second chip 300 is conducted to the second heat sink 70 of the fan set 10 through the second heat pipe 50, and then dissipated by the fan set 10. Thus, the problem of the position of the heat source is solved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heat sink module for dissipating heat from a heat source on a motherboard, comprising:
    a fan set integrated as a whole and provided with a plurality of hook portions and a plurality of first lugs around the fan set; and
    a heat sink plate extending from the heat source to the above of the fan set, wherein the heat sink plate has a plurality of ear portions corresponding to the hook portions, so that the fan set is combined as the hook portions catch the ear portions; and the heat sink plate has a plurality of second lugs with a plurality of screws passing through the corresponding first lugs and second lugs respectively and then fixed on the motherboard, so that the fan set is sandwiched between the heat sink plate and the motherboard.

2. The heat sink module as claimed in claim 1, wherein the material of the fan set is plastic.

3. The heat sink module as claimed in claim 1, wherein the material of the heat sink plate is aluminum or an aluminum alloy.

4. A heat sink module for dissipating heat from a heat source on a motherboard, comprising:
    a first heat sink, covering the heat source;
    a fan set, integrated as a whole and provided with a plurality of hook portions and a plurality of first lugs around the fan set;
    a heat sink plate, covering the fan set, wherein the heat sink plate has a plurality of ear portions corresponding to the hook portions, so that the fan set is combined as the hook portions catch the ear portions; and the heat sink plate has a plurality of second lugs with a plurality of screws passing through the corresponding first lugs and second lugs respectively and then fixed on the motherboard, so that the fan set is sandwiched between the heat sink plate and the motherboard; and
    a heat pipe, with one end on the heat source and the other end on the heat sink plate for conducting heat from the heat source to the heat sink plate.

5. The heat sink module as claimed in claim 4, wherein the material of the first heat sink is aluminum or an aluminum alloy.

6. The heat sink module as claimed in claim 4, wherein the material of the fan set is made of plastic.

7. The heat sink module as claimed in claim 4, wherein the material of the heat sink plate is aluminum or an aluminum alloy.

8. The heat sink module as claimed in claim 4, wherein the material of the heat pipe is aluminum or an aluminum alloy.

* * * * *